(12) United States Patent
Johnson

(10) Patent No.: US 6,491,742 B1
(45) Date of Patent: Dec. 10, 2002

(54) ESRF COOLANT DEGASSING PROCESS

(75) Inventor: Wayne L. Johnson, Phoenix, AZ (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/774,182

(22) PCT Filed: Aug. 3, 1999

(86) PCT No.: PCT/US99/17520

§ 371 (c)(1),
(2), (4) Date: Feb. 5, 2001

(87) PCT Pub. No.: WO00/07688

PCT Pub. Date: Feb. 17, 2000

Related U.S. Application Data

(60) Provisional application No. 60/095,035, filed on Aug. 3, 1998.

(51) Int. Cl.[7] .............................................. B01D 19/00
(52) U.S. Cl. ......................................... 95/266; 96/193
(58) Field of Search ........................ 95/254, 256, 266, 95/8, 247; 96/156, 193, 201

(56) References Cited

U.S. PATENT DOCUMENTS

| 3,591,946 A | 7/1971 | Loe |
| 3,894,171 A | 7/1975 | Kusay |
| 4,456,172 A | 6/1984 | Roffelsen |
| 4,718,922 A | 1/1988 | Roffelsen |
| 5,234,529 A | 8/1993 | Johnson |
| 5,269,832 A | 12/1993 | Meijer |
| 5,343,705 A | 9/1994 | Athey et al. |

*Primary Examiner*—Duane S. Smith
(74) *Attorney, Agent, or Firm*—Oblon, Spivak, McClelland, Maier & Neustadt, P.C.

(57) ABSTRACT

A method and system for cooling an electrostatically shielded radio frequency (ESRF) plasma source. The method and system provide for evolving gases in liquid coolant baths by generating a vacuum to remove the adsorbed gases, thereby decreasing the conditioning time for liquid coolants. The degassed coolants are cooled using a heat exchanger. The method and system further provide a rapid drain of the tubing and a rapid refill of the degassing chamber.

5 Claims, 2 Drawing Sheets

FIG. 2
OPERATION SPECIFICATIONS

| VALUE/PUMP # | NORMAL OPERATION | DEGAS MODE | RAPID DRAIN | REFILL FROM SURGE TANK |
|---|---|---|---|---|
| 110a | OPEN | OPEN | CLOSED | CLOSED |
| 110b | CLOSED | CLOSED | CLOSED | OPEN |
| 110c | CLOSED | CLOSED | OPEN | CLOSED |
| 110d | OPEN | OPEN | CLOSED | CLOSED |
| 110e | CLOSED | CLOSED | OPEN | CLOSED |
| 110f | OPEN | OPEN | CLOSED | CLOSED |
| 110g | CLOSED | CLOSED | OPEN | OPEN |
| 110h | OPEN | OPEN | OPEN | CLOSED |
| 125 | ON | ON | ON | ON |
| 140 | ON | ON | ON | OFF |
| 165 | OFF | ON | ON | OFF |
| 180 | OFF | OFF | OFF | ON |

ESRF COOLANT DEGASSING PROCESS

CROSS-REFERENCE TO CO-PENDING APPLICATIONS

The present application is related to and claims priority to U.S. provisional application Ser. No. 60/095,035, filed Aug. 3, 1998, and entitled "ESRF COOLANT DEGASSING PROCESS." The contents of that application are incorporated herein by reference.

The present application is related to the following co-pending applications: Ser. No. 60/059,173, entitled "Device and Method for Detecting and Preventing Arcing in RF Plasma Systems," Ser. No. 60/059,151, entitled "System and Method for Monitoring and Controlling Gas Plasma Processes," and Ser. No. 60/065,794, entitled "All-Surface Biasable and/or Temperature-Controlled Electrostatically-Shielded RF Plasma Source." The present application is also related to co-pending application Ser. No. 60/095,036 entitled "ESRF CHAMBER COOLING SYSTEM AND PROCESS," filed Aug. 3, 1998, and International application serial number PCT/US99/17516, entitled "ESRF CHAMBER COOLING SYSTEM AND PROCESS," filed August 3, 1999, also naming Wayne L. Johnson as an inventor. Each of those co-pending applications is incorporated herein in its entirety by reference.

BACKGROUND OF THE INVENTION

FIELD OF THE INVENTION

In order to fabricate semiconductor wafers with submicron features using etch and deposition processes, modem semiconductor processing systems utilize plasma assisted techniques such as reactive ion etching (RIE), plasma enhanced chemical vapor deposition (PECVD), sputtering, reactive sputtering, and ion assisted physical vapor deposition (PVD). In addition to the above-referenced co-pending applications, another example of a gas plasma processing system is described in U.S. Pat. No. 5,234,529, to Wayne L. Johnson, the inventor of the present application. In such known systems, a gas is introduced to a processing environment wherein a gas plasma is formed and maintained through the application of radio frequency (RF) power. Typically, RF power is inductively coupled to the plasma using a helical coil.

Normally, the generation of a gas plasma also produces a substantial amount of heat that must be removed in order to maintain the processing system at a process-specific temperature. The removal of this heat has heretofore been inefficient and based on a cumbersome design. Known ESRF plasma sources have been cooled using baths of liquid coolants, such as FLUORINERT Electronic Liquid, which also act as dielectrics. The definition of a good dielectric at radio frequencies is that the fluid must have a low power loss per unit volume when exposed to an intense electric field. However, these particular fluids disadvantageously adsorb large quantities of gas, such as air. In other words, liquid (coolant) surfaces exposed to air (and other gases) adsorb the gas into the surface layer. This adsorbed gas is then dispersed throughout the liquid (volume or interior) when the liquid is mixed (i.e., moving or being pumped through the cooling system). Furthermore, gas may be adsorbed into the coolant after the coolant pumps are stopped. When the pumps stop, if coolant in the high parts of the system drains to lower parts, then air replaces the drained coolant. When the pumps are restarted, the air may be broken down into bubbles which become another source of adsorbable gas.

In the high field regions, strong dissipation can occur leading to high local heating, hence, raising the local temperature of the coolant fluid. In so doing, the rate of gas evolution is increased permitting more gas to come out of solution, and generate bubbles that coalesce on the coil surface attracted by dielectro-fluoretic attraction. The attached bubbles generate a dielectric difference at the coil surface which leads to enhanced non-uniform electric fields, localized heating, and arcing. This arcing can occur at voltages well below the measured dielectric strength of the fluid if the gas is not evolved from the liquid coolant before use in the resonator cavity. For example, FLUORINERT Electronic Liquid adsorbs a volume of gas equivalent to its own liquid volume and must be treated to remove the trapped gas.

In order to avoid arcing due to the rapid evolution of adsorbed gas, known systems gradually increase power to the plasma source while continuously pumping coolant through the ESRF plasma chamber. The gradual increase in RF power takes place over a period of time sufficient to slowly evolve adsorbed gas from the coolant. Although running the coolant in this way evolves trapped gases, a considerable amount of time is required. Often this process will take hours, thereby delaying the use of the plasma system.

In addition to the lengthy time period required by known systems to evolve adsorbed gas, the cooling systems coupled to a plasma source may be very cumbersome due to the large cooling lines used in large wafer (i.e., 300 rnm) processing systems. Consequently, significant amount of air is generally adsorbed when the processing chamber has been opened with the coolant lines remaining attached. The lines have typically remained attached since the coolant lines may contain hundreds of pounds of coolant. As a result, lifting the attached lines to open the chamber has been difficult, but not impossible.

Previously, it was not known how to replace the large lines with an alternate cooling mechanism. The large lines were required in order to provide the large coolant exchange (e.g., approximately 50–75 gallons/minute) needed to remove the heat from the process tube. Also, flexible lines were difficult or impossible to use because of the weight and pressure of the coolant required.

SUMMARY OF THE PRESENT INVENTION

It is an object of the present invention to provide an improved method and system for cooling an ESRF source that reduces a delay when conditioning a dielectric fluid.

It is another object of the present invention to reduce the conditioning delay while performing at least one of the following tasks: (1) increasing the reliability of the liquid coolant as a dielectric, (2) increasing the plasma density, and (3) increasing the starting range of the coolant. The latter two tasks relate to alleviating the stringent conditions placed upon the application of RF power to the plasma source in order to avoid failure of the coolant and, hence, premature coil arcing. By conditioning the coolant to avoid premature arcing, the RF plasma source may be run at nominal power (instead of some reduced power level). Therefore, a nominal plasma density may be obtained, and robust start conditions can be achieved without significant delay (due to ramping the RF power).

It is a further object of the present invention to reduce the conditioning delay while decreasing the number, frequency, or severity of cavity failures, i.e., coil arcing.

These and other objects of the present invention are achieved according to a method and system of degassing a liquid coolant used in an RF plasma source-based processing system. By utilizing a vacuum to remove the gas that has been adsorbed into the liquid coolant, the system reduces arcing caused by micro-bubbles attached to the surface of a submerged coil.

BRIEF DESCRIPTION OF THE DRAWINGS

A more complete appreciation of the invention and many of the attendant advantages thereof will become readily apparent with reference to the following detailed description, particularly when considered in conjunction with the accompanying drawings, in which:

FIG. 2 is a table showing the status of each of the valves and pumps shown in FIG. 1.

DETAILED DESCRIPTION OF THE PREFERRED EMBODIMENTS

Figure 1:
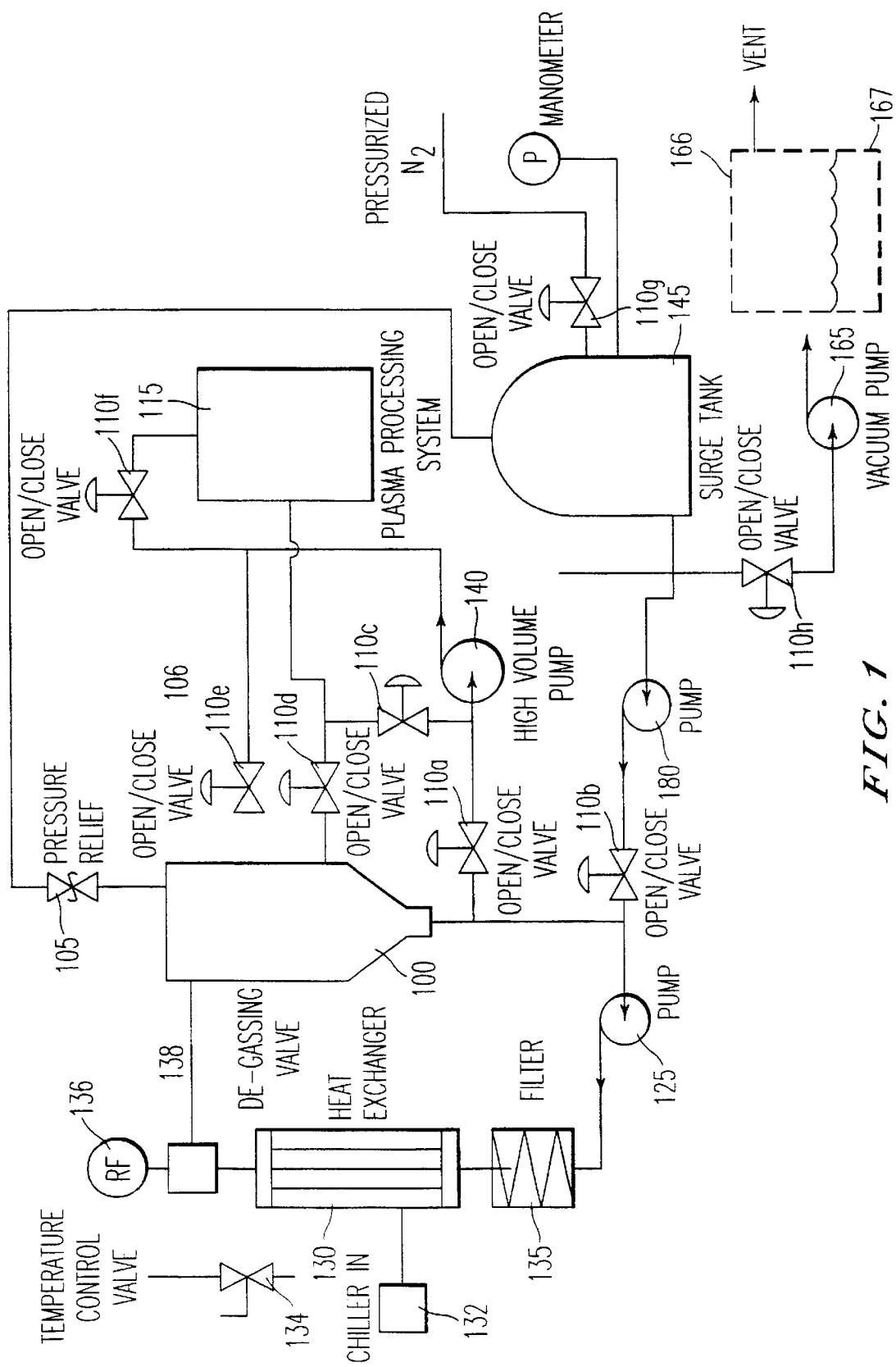
FIG. 1 is a schematic illustration of a degassing configuration for an ESRF plasma processing system.

In the present invention, an ESRF system is cooled without encountering problems previously associated with the use of untreated liquid coolants, namely arcing around induction coils. Turning now to the drawings in which like reference numerals designate identical or corresponding parts throughout the several views, FIG. 1 is a schematic illustration of a degassing configuration for an ESRF plasma processing system. The ESRF plasma source includes at least one induction coil submerged in a bath of coolant, such as FLUORINERT Electronic Liquid. The degassing system can be used in any one of at least four modes: (1) normal operation which occurs during plasma processing, (2) degassing mode which occurs either before or after processing, (3) rapid drain which occurs when the system is to be evacuated for maintenance or other work in which the coolant is not needed, and (4) refill mode in which the degassing chamber is refilled with coolant from an auxiliary source.

According to the present invention, normal operation of the system involves pumping degassed liquid coolant through a plasma processing system 115 in order to effectively cool, by means of forced convection, the plasma source chamber and maintain a pre-specified temperature. Referring to FIGS. 1 and 2, the fluid flow cooling loop consists of pumping coolant from the bottom of a coolant basin (i.e., the degas chamber 100) through valve 110a using a high volume pump 140, through which the pump provides the necessary total pressure head required to drive the coolant through valve 110f and the plasma processing chamber 115. The cooling cycle is complete upon returning the coolant to the coolant basin (or degas chamber 100) through valve 110d. This coolant cycle, driven by pump 140, removes heat from the plasma processing chamber and deposits it within the coolant basin (degas chamber) 100. The pumping cycle between the degassing chamber 100 and the plasma processing system 115 continues in order to maintain the plasma processing chamber 115 at a pre-specified temperature. A pre-specified temperature may be derived by determining the heat load of the plasma processing chamber 115 and considering the rate of removal of heat by the coolant cycle (the plasma processing chamber 115 cooling rate is determined by the coolant flow rate, the coolant fluid properties, and the plumbing design within the chamber itself.)

In order to maintain the temperature of the coolant within the coolant basin (degas chamber) 100, a second cooling cycle is provided that incorporates a heat exchanger 130 wherein heat is exchanged between the coolant and chilled water provided from an exterior source. The amount of cooling can be regulated by adjusting the amount of cool water that flows to take heat away from the heated coolant. The second cooling cycle involves pumping coolant from the bottom of the coolant basin (degas chamber 100) using pump 125 through a filter 135 and then through the heat exchanger 130. Note that both cooling cycles (one to the plasma processing chamber and the other to the heat exchanger 130) share the same exit line from the degas chamber. The plumbing is not limited to this design, however, it may in fact have two or more lines to perform these tasks. As shown, the heat exchanger 130 is coupled to a chiller 132 which exchanges heat between the coolant and the chilled water supply. A temperature control valve 134 is located such that the temperature of the chilled water source after the heat exchanger 130 may be monitored. If the chilled water temperature differential becomes significant (greater than several, 2–5° C., degrees centigrade), then the chilled water flow rate may be increased. The cooled water and the coolant flow continuously. The amount of cooling is determined by how much the chilled water valve is open.

When the coolant has been cooled to a target temperature, a temperature control valve 134 signals the pump 125 to begin pumping and allows the coolant to return to the degassing chamber 100. Upon returning the coolant from the heat exchanger 130 to the coolant basin (degas chamber) 100, a RF current flow monitor 136 is placed at an intermediate location along the return line 138. The present invention further includes a method for determining when a coolant should be degassed. Accordingly, the level of gas adsorption within the coolant is determined by using an RF voltage applied to a sample chamber, and the resultant current flow is measured. The RF current flow is a measure of the dielectric strength of the fluid. Moreover, the dielectric strength of the coolant is directly affected by the presence of adsorbed gas within the coolant. Therefore, the present invention can automatically assess whether degassing is required by periodically performing this test. If degassing is required, an operator can be notified or degassing can automatically be performed at the end of the next processing step.

Due to (limited) exposure of the coolant fluid surfaces to air (and/or other gases) during shutdown (and other various times), the cooling system requires periodic degassing to remove the adsorbed gases within the coolant. (The amount of adsorbed gases in the present invention is also reduced by the design and placement of the coolant basin itself. The coolant basin is arranged as the highest placed unit in the cooling system, and all outlets for coolant tubes remain submerged in coolant when the pumping system is stopped.) During the degassing mode, the vacuum pump 165 evacuates the vapor existing within the vapor space of the surge tank 145 and the vapor residing in line 106, once valve 110h is opened. In so, doing, the pressure within the surge tank vapor space and the line 106 leading to the degas chamber 100 is reduced, hence, generating a pressure difference sufficient to open the pressure relief valve 105. Upon opening the pressure relief valve 105, evolved gas from the vapor space within the degas chamber 100 escapes. Intermittently, the pressure relief valve 105 closes and reopens, respectively, as the vapor in the degas chamber 100 is evacuated and as pressure rebuilds with the evolution of adsorbed gas. When the vapor space within the degas chamber 100 is evacuated, the pressure is reduced, hence, allowing a greater rate of gas de-adsorption. The pressure that causes gas evolution from the coolant is higher than the vapor pressure of the coolant. With proper control of the evacuation process, this allows removing of the gas from the fluid without excessive evaporation of the liquid. In order to effectively and efficiently degas the coolant residing within the two cooling cycle lines and the plasma processing chamber 115, the high volume pump 140 is turned on, in addition to opening valves 110*a*, 110*f*, and 110*d*, for coolant circulation. Furthermore, pump 125 is turned on to circulate degassed coolant through the second cooling cycle line.

The present invention can also drain the coolant from the plasma processing system 115 when the system 115 is not operational, e.g., during wafer changing or maintenance. This operation is referred to herein as a rapid drain mode. During the rapid drain mode, pump 140 evacuates the plasma processing system 115 of coolant through valve 110*c* and displaces the coolant into the degas chamber 100 through valve 110*e*. When excess coolant is displaced to the degas chamber 100, the pressure relief valve 105 opens and allows for coolant overflow into the surge tank 145 via line 106. Upon evacuating the plasma processing system 115, valves 110*c* and 110*e* may be closed, and pump 140 may be shut down. At this point, the plasma processing chamber may be opened for maintenance or other servicing. For a period of time (depending on the time for servicing the plasma processing chamber 115), the coolant may be cooled through the head exchanger 130 using pump 125. Furthermore, pump 165 evacuates vapor from the surge tank 145 through valve 110*h*, and alleviates any pressure build-up within the surge tank 145 due to the expulsion of gas vapor from the degas chamber 100 through the pressure relief valve 106 as coolant fills the degas chamber 100. In an alternate embodiment, an optional cooled trap 166 is interposed between the pump 165 and the vent to capture (by condensation) coolant before it is vented. This reduces loss of the coolant that may be expensive. The condensed coolant 167 may be reintroduced into the degassing chamber as required—either manually or through a pump (not shown).

The plasma processing source can also be rapidly prepared to receive cooled coolant. When refilling from the surge tank 145, pumps 180 and 125 pump coolant through valve 110*b* and into the degassing chamber by way of the filter, heat exchanger 130 and the return line 138. To replace the coolant that is pumped out of the surge tank 145, valve 110*g* is opened to admit pressurized $N_2$ which does not cause arcing if adsorbed into the coolant. When sufficient coolant has been added to the degas chamber, the valves 110*a* and 110*f* are opened to allow coolant to be pumped into the process system 115. The system is then returned to normal operation. in this way, the present invention reduces the amount of time required to remove gas that would otherwise remain trapped in the coolant and contribute to arcing of the induction coil(s). In another embodiment, the fluid is pumped under normal conditions while a vacuum is generated to reduce the pressure above the fluid and continuously degas the fluid.

Obviously, numerous modifications and variations of the present invention are possible in light of the above teachings. It is therefore to be understood that, within the scope of the appended claims, the invention may be practiced otherwise than as specifically described herein.

What is claimed is:

1. A method of treating a liquid coolant with an adsorbed gas, the method comprising the steps of:

storing a liquid coolant including an adsorbed gas in a degassing chamber;

lowering a pressure above the liquid coolant by using a vacuum;

removing the adsorbed gas as the adsorbed gas comes out of the liquid coolant to form a degassed coolant; and pumping the degassed coolant to a plasma processing system to remove heat from the plasma processing system.

2. The method as claimed in claim 1, wherein the step of pumping comprises pumping the degassed coolant into a storage chamber housing a submerged inductive coil in the plasma processing system.

3. The method as claimed in claim 1, further comprising the step of cooling the degassed coolant using a heat exchanger.

4. The method as claimed in claim 1, wherein the step of lowering the pressure comprises opening a pressure relief valve in the degassing chamber by running a vacuum pump connected to the pressure relief valve.

5. A method of treating a liquid coolant with an adsorbed gas, the method comprising the steps of:

storing a liquid coolant including an adsorbed gas in a degassing chamber;

lowering a pressure above the liquid coolant by using a vacuum;

removing the adsorbed gas as the adsorbed gas comes out of the liquid coolant to form a degassed coolant;

applying an RF voltage to a sample of the coolant;

measuring an RF current created in the sample based on the RF voltage applied; and determining an amount of trapped gas based on the measured RF current.

\* \* \* \* \*

UNITED STATES PATENT AND TRADEMARK OFFICE
CERTIFICATE OF CORRECTION

PATENT NO. : 6,491,742 B1
DATED : December 10, 2002
INVENTOR(S) : Wayne L. Johnson It is certified that error appears in the above-identified patent and that said Letters Patent is hereby corrected as shown below:

Column 1,
Line 32, change "modem" to -- modern --.

Column 2,
Line 29, change "300 rnm" to -- mm --.

Column 4,
Line 18, change "C.," to -- C, --.

Column 5,
Line 48, change "in" to -- In --.

Column 6,
Line 45, change the formatting of the last paragraph as follows:
-- measuring an RF current created in the sample based on the RF voltage applied; and
   determining an amount of trapped gas based on the measured RF current. --

Signed and Sealed this

Seventeenth Day of June, 2003

JAMES E. ROGAN
*Director of the United States Patent and Trademark Office*